United States Patent
Hatano

(10) Patent No.: US 7,372,110 B2
(45) Date of Patent: May 13, 2008

(54) DISPLAY WITH INTEGRAL SOUND WAVE GENERATION DEVICE

(75) Inventor: Mutsuko Hatano, Kokubunji (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

(21) Appl. No.: 11/771,713

(22) Filed: Jun. 29, 2007

(65) Prior Publication Data

US 2008/0048182 A1    Feb. 28, 2008

(30) Foreign Application Priority Data

Aug. 25, 2006  (JP)  ............... 2006-228722

(51) Int. Cl.
*H01L 49/00*    (2006.01)
*H01L 29/786*   (2006.01)
*H04R 23/00*    (2006.01)

(52) U.S. Cl. ............... 257/379; 381/164; 257/528; 257/E27.008

(58) Field of Classification Search .............. 257/379, 257/528; 381/164
See application file for complete search history.

(56) References Cited

U.S. PATENT DOCUMENTS

2004/0131211 A1* 7/2004 Miyata et al. ............... 381/152
2005/0201575 A1* 9/2005 Koshida et al. ............. 381/164
2007/0080905 A1* 4/2007 Takahara ..................... 345/76

FOREIGN PATENT DOCUMENTS

JP        2003-179988 A    6/2003
JP        2005-73197 A     3/2005

* cited by examiner

*Primary Examiner*—Evan Pert
(74) *Attorney, Agent, or Firm*—Miles & Stockbridge P.C.

(57) ABSTRACT

A display housing a sound element and a driving circuit that may be built in on the same substrate as the display panel. Thin-film transistors PTFT constituting pixels and a sound wave generation device SPO1 having a laminated structure of a heat generation layer 700, a heat insulation layer 701 and a heat radiation layer 702 are formed on a thin-film transistor (TFT) substrate 500 on which polysilicon thin-film transistors PTFT are formed.

19 Claims, 16 Drawing Sheets

AMORPHOUS SEMICONDUCTOR

GRANULAR POLYCRYSTALLINE SEMICONDUCTOR

LATERAL GROWTH CRYSTALLINE SEMICONDUCTOR

DISPLAY WITH INTEGRAL SOUND WAVE GENERATION DEVICE

CLAIM OF PRIORITY

The present application claims priority from Japanese application JP 2006-228722 filed on Aug. 25, 2006, the content of which is hereby incorporated by reference into this application.

FIELD OF THE INVENTION

The present invention relates to a display having a speaker constituted by a sound wave generation device for converting electric signals into voice, and the direct input function of a touch panel or pen-based input having a pressure-sensitive sensor provided on the same substrate as the display panel, suitable particularly to an active matrix-type display.

BACKGROUND OF THE INVENTION

Active matrix-type displays (or active matrix-type drive imaging displays, or simply called display devices) in which the active element of thin-film transistor and the like is used as the driving element of pixels arranged in matrix are widely used.

Many of displays of this type can display good picture images by arranging a large number of pixel circuits formed by active elements such as thin-film transistors (TFT) formed by using silicon films as semiconductor films, and a drive circuit for supplying these pixel circuits with display signals on the insulating substrate.

On the other hand, the prior art relating to a display incorporating a speaker system, a mobile terminal and an electronic appliance incorporating a speaker system is disclosed in JP-A No. 2003-179988. FIG. 23 is a sectional view describing a mobile terminal on which the traditional display incorporating a speaker system is mounted. This mobile terminal 1000 is a speaker system disclosed in JP-A No. 2003-179988. As FIG. 23 shows, the mobile terminal includes a display panel 21 for displaying the image, a transparent panel 24 disposed in such a way that the image displayed in the display panel 21 may be visible transparently, an electromechanical sound transducer 22 having a diaphragm for emitting sound by oscillating the diaphragm in response to electric signals, a elastic body 25 connected with the peripheral edge of the transparent panel 24, and a structure 20 for supporting the transparent panel 24 and the display panel 21.

An acoustic transmission member is provided in the space 26 formed between the display panel 21 and the transparent panel 24 to transmit the sound emitted from the electromechanical sound transducer 22 through a sound hole 23, and the transparent panel is made vibratile by the sound transmitted to the space from the electromechanical sound transducer by the acoustic transmission member. The display panel 21 and the electromechanical sound transducer 22 are respectively formed on separate substrates.

The JP-A No. 2005-73197 proposes a sound wave generation device including a thermal conductive substrate, an insulation layer made of Porous silicon on which a large number of holes are formed on one surface of the substrate, and a heating element thin film constituted by a metal film formed on the insulation layer and driven electrically. This is a device for generating sound wave by creating a difference in the degree of compression of air by heating air, and provides a new sound wave generation device useful for ultrasonic sound sources, speaker sound sources, actuators and the like and the method of producing the same.

SUMMARY OF THE INVENTION

JP-A No. 2003-179988 discloses that the display panel and the electro-mechanical sound transducer, i.e. speaker are formed on separate substrates. As a result, there was a problem in that mobile phone and other mobile terminals whose components must be compact and thin are faced with the lack of freedom of arrangement and the difficulty of making the whole product thin. In addition, since sound waves were created by generating compression waves in the gas contained in air due to mechanical vibration, the resulting vibration of the terminal was a problem. Furthermore, the mechanical vibration results in a resonance point, and any slippage of the input frequency from the resonance point results in a sharp drop in acoustic pressure. This is a frequency characteristic of the resonance type, and thus there is a limit in its acoustic range.

On the other hand, since the one disclosed in JP-A No. 2005-73197 uses nano-crystalline silicon formed on a silicon mono-crystalline wafer substrate, it is difficult to form the same on the insulation substrate, and its integral formation with the display panel constitutes an issue.

The object of the present invention is to solve the issue described above, and to provide a display wherein the image as seen by the user is displayed at the same position as the one from which sound is emitted, a high degree of freedom for the location of speakers, each speaker operating with a low power consumption, simple in construction and highly integrated, that can be easily made compact and slim, having a wide range of output and provided with sound source elements capable of containing a drive circuit on the same substrate as the display panel.

Another object of the present invention is to provide a display wherein actuators for performing the touch panel function without causing any fall in the display performance are integrally formed along with the display panel by containing a pressure-sensitive sensor constituted by transparent electrode in each pixel.

In order to achieve the object described above, the present invention applies the following means in a display driven by thin-film transistors wherein semiconductor films formed on the insulating substrate are used as channels.

(1) Sound wave generation devices constituted by the heat generation layer formed on the heat radiation layer, the heat insulation layer and the heat generation layer formed on the heat insulation layer on the same substrate as the insulating substrate are adopted. The sound wave generation device shall have a speaker function.

For the heat radiation layer, the first polycrystalline semiconductor film with a specific heat conductivity of A is used, and for the heat insulation layer, any one of the second polycrystalline or amorphous semiconductor transistor films formed on the heat radiation layer and having a specific heat conductivity of B is used. And for the heat generation layer, a metal thin film is deposited on the insulation layer. The specific heat conductivity A is made larger than the specific heat conductivity B. It is preferable to make the specific heat conductivity A twice or larger than the specific heat conductivity B.

And in the present invention, for the heat radiation layer the first metal thin film having a specific conductivity of A is used, and for the insulation layer any one of the second polycrystalline or amorphous semiconductor transistor films formed on the heat radiation layer and having a specific heat conductivity of B is used. For the heat generation layer, a metal thin film formed on the heat insulation layer is formed. The specific heat conductivity A is made larger than the specific heat conductivity B. It is preferable to make the specific heat conductivity A twice or larger than the specific heat conductivity B.

And in the present invention, the heat radiation layer may be constituted by any one of the following (1), (2) and (3). (1) To be constituted by the same layer as the semiconductor thin film constituting the channels of the thin-film transistors. (2) To be constituted by the same layer as the gate electrode of the thin-film transistors. (3) To be constituted by the same layer as the source or drain electrode of the thin-film transistors.

And in the present invention, the heat insulation layer may be constituted by the same layer as the semiconductor thin film constituting the channel of the thin-film transistors.

And in the present invention, it is preferable to dispose the sound wave generation device within each pixel of the display or within 5 mm from the peripheral edge of the display. And at least a part of the drive circuit of the sound wave generation devices may be constituted by the thin-film transistors formed on the insulation layer.

And in the present invention, pressure-sensitive devices may be provided on the same substrate as the insulating substrate. Such pressure-sensitive devices are constituted by diaphragms constituting their capacitance by two layers of transparent conductive thin films in the visible light range through a gap and detect changes in pressure by the capacitance. The pressure-sensitive devices have a function of generating acoustic responses by oscillating in response to the electric signals acting mutually with the diaphragms, and are suitable for having a built-in direct input function by means of touch panel or pen-based input in the display area.

And in the present invention, at least the signal line drive circuit is constituted by thin-film transistors by providing pixels arranged in the matrix form and a scanning line drive circuit and a signal line drive circuit for matrix driving the pixels on the insulating substrate.

And the display according to an embodiment of the present invention may be a liquid crystal display constituted by the insulating substrate, an opposed substrate disposed facing the same at predetermined intervals, and liquid crystal encapsulated between the insulating substrate and the opposed substrate.

And the display according to an embodiment of the present invention may be an organic EL display constituted by light-emitting elements wherein the pixel has an organic EL layer.

And the display according to an embodiment of the present invention may be constituted by an active matrix substrate having high-characteristic semiconductor thin-film transistors operating with a high performance and a high reliability, and having an outstanding uniformity among devices superposed on a low-priced insulating substrate such as glass or plastic.

In the mean while, it is needless to say that the present invention is not limited to the above-mentioned structure and the structure described in the detailed descriptions of the present invention that follow, and that various variations are possible provided that they do not deviate from the technological philosophy of the invention described in the claims of the present invention.

According to an embodiment of the present invention, a part of the display surface or the whole display surface may be used as a speaker for outputting sounds. In particular, in a mobile phone, it can be used as a speaker for outputting received phone message. Due to the possibility of emitting sounds from the display surface, the present invention has an effect of realizing a natural and realistic sound reproduction matching images.

And according to an embodiment of the present invention, the speaker can be positioned with a high degree of freedom on the display surface, the whole system can be made compact and slim, a low-power-consumption speaker having a wide range of sound output can be formed on the same substrate as the display while maintaining the quality of the image displayed and the received telephone messages can be clearly understood.

In addition, the built-in direct input function on the display such as touch panel, pen-based input and the like and the actuator (acceleration sensor and the like) function based on detection pressure can be housed within the display without sacrificing display performance, and a slim, compact and high picture-quality display can be obtained by containing a pressure-sensitive sensor constituted by a transparent electrode in each pixel.

DETAILED DESCRIPTION OF THE PREFERRED EMBODIMENTS

We will describe below the preferred embodiments of the present invention with reference to the drawings of the embodiments. It should be noted that we assume that silicon (Si) is mainly used as the material for semiconductor thin films. However, the same effect can be obtained by using Ge, SiGe, compound semiconductors, chalcogenide and other thin film materials. In the following embodiments, we will explain by using generally available silicon.

And in the present invention, the insulating substrate of the display is not limited to glass, and other insulating substrates, for example plastic substrates, film, reformed similar semiconductor films formed on a silicon wafer can be similarly used. In addition, we assumed the use of a liquid crystal display for the display. However, similar effects can be obtained by using organic EL displays, electrophoretic displays and the like.

First Embodiment

Figure 1:
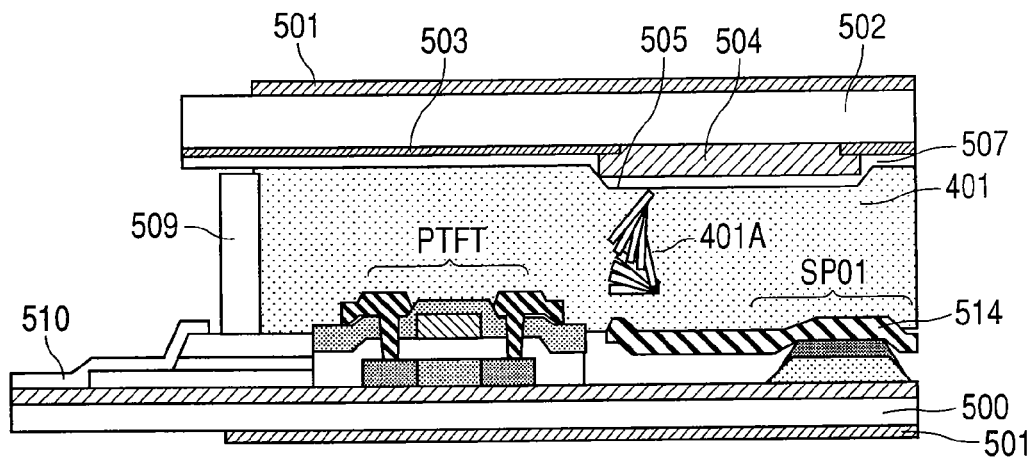
FIG. 1 is a sectional view describing the structure of a liquid-crystal display with a built-in sound wave generation device according to the first embodiment of the present invention.
Figure 2:
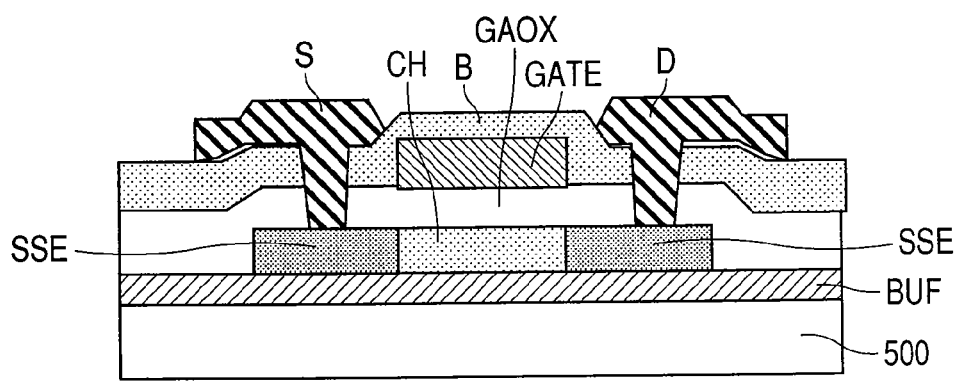
FIG. 2 is a sectional view describing the structure of a polysilicon thin-film transistor.
Figure 3A:
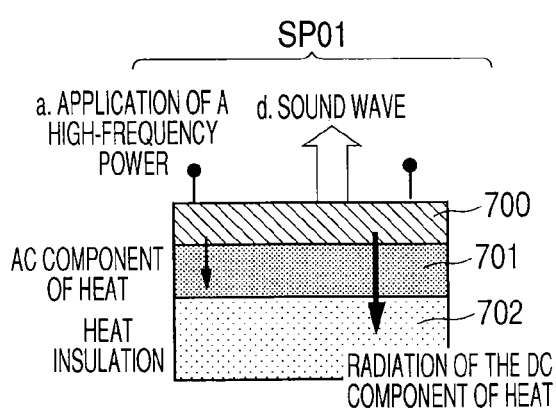
FIG. 3 is an illustration describing the principle of operation of the sound wave generation device according to an embodiment of the present invention.
Figure 3B:
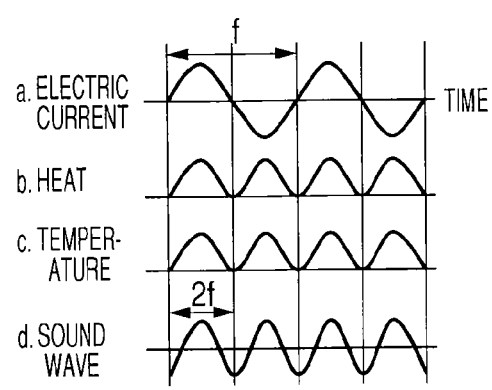

FIG. 1 is a sectional view of a liquid crystal display with built-in sound wave generating device for describing the first embodiment of the present invention. FIG. 2 is a sectional view of showing the structure of a polysilicon thin-film transistor PTFT. FIG. 3 is an illustration describing the principle of a sound wave generation device according to an embodiment of the present invention, and FIG. 3(a) is a sectional view for describing its structure, while FIG. 3(b) is a graphic describing the operational waveform of various parameters.

As FIG. 1 shows, the liquid crystal display according to the first embodiment of the present invention is constituted by a thin-film transistor (TFT) substrate 500 on which polysilicon thin-film transistors PTFT for driving the liquid crystal or constituting driver circuits and a color filter substrate 502 are formed facing each other. On the color filter substrate 502, a color filter 504 divided by a black matrix 503 is formed, on top of which a common electrode (opposed electrode) 505 is formed through an overcoat layer 507. On the TFT substrate 500, thin-film transistors PTFT and sound wave generation devices SPO1 are formed.

And a liquid crystal layer 401 is encapsulated between the TFT substrate 500 and the color filter substrate 502, and the periphery is sealed with the seal 509. The way the orientation of the liquid crystal molecules of the liquid crystal layer 401 is controlled by the application of an electric field is schematically illustrated by the reference code 401A. Although there is an orientation film in the interface between this TFT substrate 500 and the liquid crystal layer 401 of the color filter substrate 502, we have omitted the same from this illustration. And the reference code 514 represents a wiring for feeding the sound wave generation device SPO1 with power and constitutes the heat generation layer of the sound wave generation device SPO1 described below. And the reference code 510 represents a pad for connecting with outside circuits. On each external surface of the TFT substrate 500 and the color filter substrate 502, a polarization plate 501 is deposited.

As FIG. 2 shows, the polysilicon thin-film transistor PTFT includes a buffer film BUF called also a foundation layer on the TFT substrate 500 constituted by a glass substrate, a channel CH made of polysilicon, a gate electrode GATE through a gate insulation film GAOX. The polysilicon film is thick approximately 50 nm or more and 500 nm or less, and a source region and a drain region SSE are formed. And a source electrode S and a drain electrode D are respectively formed in contact with these source regions and drain regions SSE. Incidentally, the reference code B represents an interlayer insulation film. The current flowing in the source region and the drain region can be controlled by adjusting the voltage applied to the gate electrode GATE.

In FIG. 3(a), the sound wave generation device SPO1 is a three-thin-film-layered heat inducing device including a heat generating thin film (hereinafter referred to also as "heat generation layer") 700 made of a low-resistance metal wiring or a transparent conductive film such as ITO or ZnO, a heat insulation layer (hereinafter referred also to as "insulation layer") 701 made of amorphous silicon, and a heat radiation layer 702 made of polysilicon.

Due to the generation of heat in the heat generation layer 700 and the provision of an insulation layer 701 having a very low specific conductivity, changes in the temperature of air above the surface of the heat generation layer 700 grows larger resulting in the generation of ultrasonic waves. Since this device is free of mechanical vibrations, it has many characteristics such as wide frequency band, hardly subject to the impacts of the environment, ease of arranging in minute arrays and the like. Upon application of an AC electric field on both ends of the heat generation layer 700, the temperature of the heat generation layer changes in the form of AC current due to Joule heating. At this time, since heat is hardly transmitted to the heat insulation layer 701 due to the adiathermancy of the heat insulation layer, heat exchange with air is efficiently realized near the surface of the heat generation layer 700, resulting in the compression and dilatation of air and the creation of acoustic pressure.

Heat that could not be converted into acoustic pressure is radiated from the heat radiation layer 702. As shown in FIG. 3(b), the generated sound wave d will have a frequency twice the applied AC frequency a. When it is desired to obtain a generated sound wave of the same frequency as the applied AC frequency a, all that is required is to superimpose a DC current of an energy half or stronger than the AC on the AC. Since the heat that could not be converted into acoustic pressure is radiated through the heat radiation layer 702, it is possible to generate a massive sound volume by inputting a powerful current into the heat generation layer 700. And as Joule heating is used, it is possible to obtain essentially a high acoustic conversion effect and a wide frequency range. Furthermore, the sound wave generation device, being slim and light, is suitable for adoption on mobile terminals.

We will describe below in further details the principle of operation of this heat inducing sound wave generation device. The change $T(\omega)$ in surface temperature following the application of an AC on the electrically driven heat generation layer 700 can be obtained by an input or output of energy per unit area equal to $q(\omega)$ [W/cm$^2$] by the following equation (1) provided that the specific heat conductivity (A) of the heat insulation layer is $\alpha 1$, the heat capacitance per volume is C1 and the angular frequency is $\omega$.

$$T(\omega)=(1-j)/\sqrt{2})(1/\sqrt{\omega\alpha 1 C1})q(\omega) \quad (1)$$

Where, $\alpha 1$: Specific heat conductivity of the heat insulation layer

C1: Heat capacitance per volume $q(\omega)$: Input/output of energy per unit area (=input electric power)

The generated acoustic pressure $P(\omega)$ will be as shown in the following equation (2).

$$P(\omega)=A\times(1/\sqrt{\alpha 1 C1})q(\omega) \quad (2)$$

In other words, as shown in FIG. 3(b), as a result of a heat exchange between the heat b generated by the heat generating body thin film by an AC current a with a frequency f supplied from a signal source generating signals with a supersonic wave frequency and air being an ambient medium, a change c occurs in the temperature of air. This leads to compression waves of air and general sound waves d with a frequency 2f.

Here, we can find from the above equation (2) that the generated acoustic pressure $P(\omega)$ is proportional to the input/output of energy $q(\omega)$ per unit area, in other words the input power, grows larger as the heat capacitance c per volume becomes smaller, and is inversely proportional to the product to the half power of specific heat conductivity ($\alpha 1$) and heat capacitance (C1). In addition, the thermal contrast of the heat insulation layer 701 and the heat radiation layer 702 plays an important role. Specifically, if, beneath the heat insulation layer 701 with a specific heat conductivity ($\alpha 1$) and a heat capacitance per volume (C1) and a thickness of L, there is a heat radiation layer 702 having a larger specific heat conductivity ($\alpha 2$) and a larger heat capacitance (C2) than the heat insulation layer 701, if we take such a thickness of the heat insulation layer 701 (heat dispersion length of the AC component) as shown in the following equation (3), the AC component of the generated heat is insulated, and the DC component heat generated due to the heat capacitance of the heat generating body can be efficiently released to the heat radiation layer 702 with a large specific conductivity ($\alpha 2$).

$$L=\sqrt{(2\alpha 1/\omega C1)} \quad (3)$$

The heat induced sound wave generation device SPO1 can be constituted with a simple laminated film by using an amorphous semiconductor thin film being a material with a small specific heat conductivity ($\alpha 1$) and a small heat capacitance (C1) as the heat insulation layer 701 and a polycrystalline semiconductor thin film having a high crystallinity with a high specific heat conductivity ($\alpha 2$) and a small heat capacitance (C2) as the heat radiation layer 702 for releasing DC component heat, and this can be integrally formed with the display.

FIG. 4 is an illustration showing the amorphous/crystalline structure of the thin film semiconductor materials forming the sound wave generation device. FIG. 4(a) is a sectional view describing the layer structure of a sound wave generation device formed on the glass structure, FIG. 4(b) describes amorphous semiconductor thin films, FIG. 4(c) describes a granular polycrystalline semiconductor thin film, and FIG. 4(d) describes a lateral growth crystalline semiconductor. Incidentally, the illustration of the glass substrate underlying the heat radiation layer 702 shown in FIG. 4(a) is omitted.

Figure 4A:
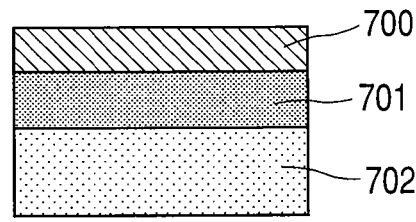
FIG. 4 is an illustration describing the amorphous/crystalline structure of the thin-film semiconductor materials constituting the sound wave generation device.
Figure 4B:
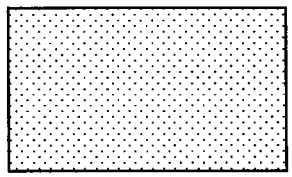
Figure 4C:
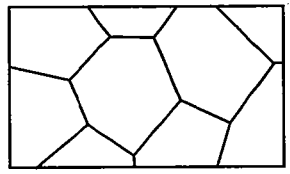
Figure 4D:
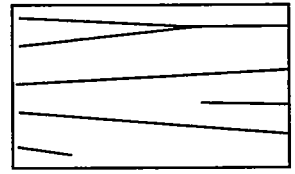

The semiconductor thin films that can be formed at a low temperature on the glass substrate not shown are broken down into, according to differences in the crystallinity of semiconductor thin film, amorphous semiconductor thin film shown in FIG. 4(b), granular polycrystalline semiconductor shown in FIG. 4(c) and lateral growth crystalline semiconductor shown in FIG. 4(d) having less crystalline defects than granular films, having a larger grain dimension and being closer to monocrystal. Specific heat conductivity a grows larger in this order, and heat capacitance grows smaller in this order. Table 1 shows the combination of materials.

TABLE 1

| | Heat generation layer | Heat insulation layer | Heat conductivity (W/mK) | Heat radiation layer | Heat conductivity |
|---|---|---|---|---|---|
| (1) | Gate wiring/ source-drain wiring | Amorphous semiconductor | Amorphous Si: 1.0 | Granular poly- crystalline semi- conductor | Granular poly Si: 10 |
| (2) | Gate wiring/ source-drain wiring | Granular poly- crystalline semi- conductor | Granular poly Si: 10 | Lateral growth crystalline semi- conductor | Lateral growth Si: 100 |

TABLE 1-continued

| | Heat generation layer | Heat insulation layer | Heat conductivity (W/mK) | Heat radiation layer | Heat conductivity |
|---|---|---|---|---|---|
| (3) | Gate wiring/ source-drain wiring | Amorphous semiconductor | Amorphous Si: 1.0 | Lateral growth crystalline semiconductor | Lateral growth Si: 100 |

As shown in Table 1(1), thermal contrasts can be realized by using an amorphous semiconductor in the heat insulation layer 701, and a granular polycrystalline semiconductor in the heat radiation layer 702. For example, the specific heat conductivity (α1) of amorphous silicon is 1.0 W/mK or less, and the heat capacitance (C1) is approximately $5 \times 10^5$ J/m³K, while the specific heat conductivity (α2) of granular polysilicon is approximately 10 W/mK, and the heat capacitance is less than approximately $10^6$ J/m³K. As shown in (2), thermal contrast may also be realized by applying a granular polycrystalline semiconductor in the heat insulation layer 701 and a lateral growth crystalline semiconductor in the heat radiation layer 702. The specific heat conductivity (α2) of the lateral growth silicon film is large at approximately 100 W/mK. As shown in (3), the maximum thermal contrast can be realized by applying an amorphous semiconductor in the heat insulation layer 701 and a lateral growth crystal semiconductor in the heat radiation layer 702. Incidentally, for realizing a thermal contrast, it is preferable that α2 would be twice or more of α1. This can be realized by changing the crystallinity, the grain size and the concentration of faults of silicon.

The material to be used in the heat generation layer 700 is not specially limited provided that it constitutes a low resistance film. For example, gold, aluminum, nickel, platinum, tungsten and the like may be used. These materials can be used to form a film by vacuum deposition, sputtering and the like. Since it is possible to have a built-in speaker without sacrificing the display performance of the whole system by applying a transparent conductive film such as ITO or ZnO, these ITO or ZnO may be considered as more suitable. And although it is preferable to make the film as thin as possible in order to reduce its heat capacitance, a thickness within the range of 10 nm-100 nm should be chosen in order to have a suitable resistance.

In the meanwhile, the arrangement of the sound wave generation device SPO1 on the TFT substrate 500 of the first embodiment can be described in the same way as the disposition of the sound wave generation device SPO1 of the second embodiment described further below.

Second Embodiment

Figure 5:
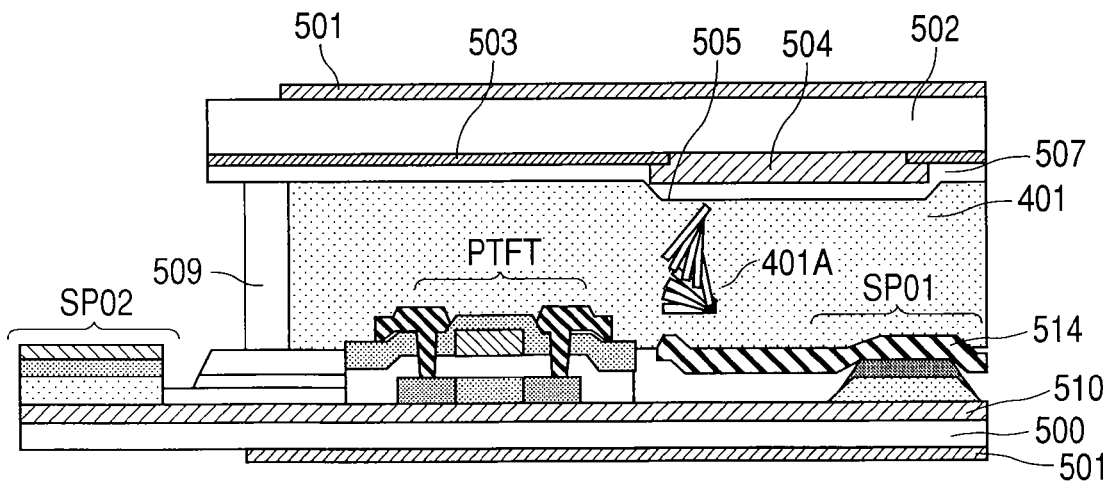
FIG. 5 is a sectional view describing the structure of a liquid crystal display with a built-in sound wave generation device according to the second embodiment of the present invention.

FIG. 5 is a sectional view of the structure of the liquid crystal display with a built-in sound wave generation device for describing the second embodiment of the present invention. The construction of the liquid crystal display as a display is similar to that of the first embodiment described in FIG. 1. The second embodiment describes a display that houses a sound wave generation device SPO2 in the perimeter on the side of the TFT substrate 500, in addition to the sound wave generation device SPO1 described in the first embodiment. The liquid crystal display is constructed in such a way that the TFT substrate 500 side may be larger than the color filter substrate 502 in order to allow connections with external circuits. In other words, it is possible to arrange a sound wave generation device SPO23 in the perimeter of the TFT substrate 500 and to enhance further the efficiency of conversion to the vibration of air.

Although FIG. 5 describes a display housing a built-in sound wave generation device SPO1 and another built-in sound wave generation device SPO2, such sound wave generation devices may be limited to one having a reference code SPO2 and arranged in the perimeter of the TFT substrate 500.

Figure 6A:
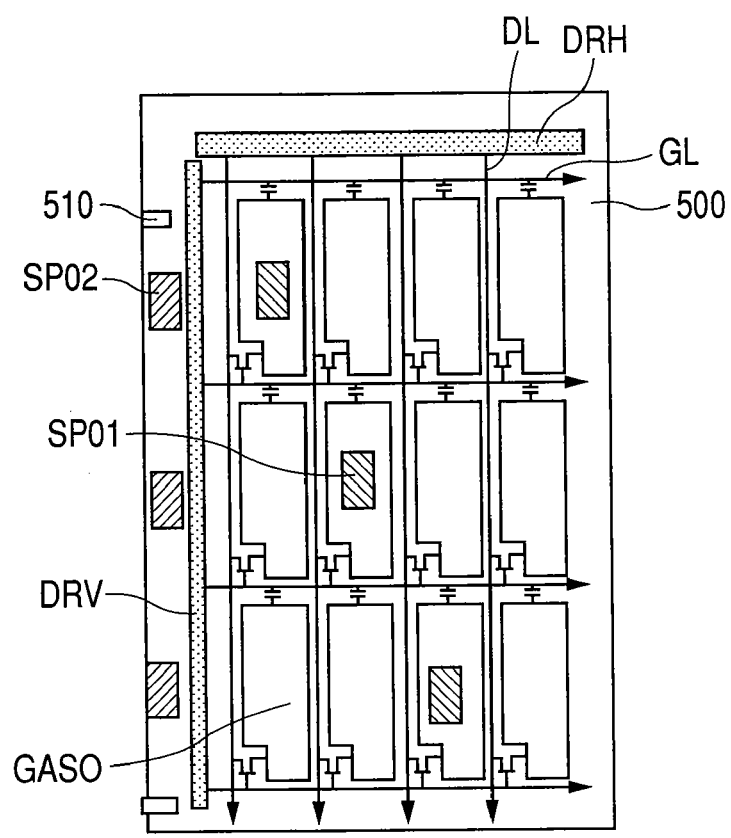
FIG. 6 is a top plan view of an important part describing the structure of the display according to the second embodiment of the present invention.
Figure 6B:
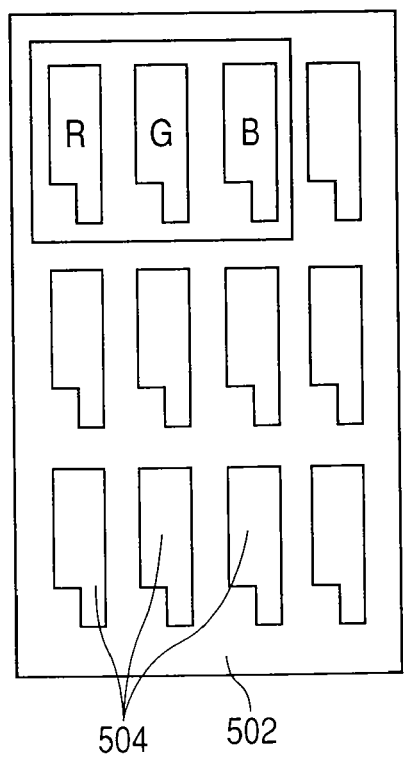

FIG. 6 is a top plan view of a required part describing the structure of the display according to the second embodiment of the present invention. FIG. 6(*a*) shows the TFT substrate, while FIG. 6(*b*) shows the color filter substrate. On the TFT substrate 500, a plurality of scanning (gate) lines GL for connecting with vertical system peripheral circuitry DRV are provided and a plurality of signal (data) lines DL for connecting with horizontal system peripheral circuitry DRH are provided. In each of the section enclosed by the gate lines GL and the data lines DL, a pixel GASO is formed. The vertical system peripheral circuitry DRV has a gate line drive circuit while the horizontal system peripheral circuitry DRH has a data line drive circuit.

As shown in FIG. 5, the sound wave generation device SPO1 serving as a speaker is arranged within the pixel while the sound wave generation device SPO2 is arranged in the periphery of the TFT substrate 500. Here, sound wave generation devices SPO1 are arranged in pixels adjacent in the oblique direction to each gate line and to each data line. Incidentally, the sound wave generation devices SPO1 may be arranged in all the pixels, or may be scattered to the discretion of the party concerned within the display area. And the sound wave generation devices SPO2 may be formed at any freely chosen points in a vacant part where no other circuit is formed in the periphery of the TFT substrate 500.

Thus according to the second embodiment the speaker may be arranged quite freely, and the construction of the whole system is simple and highly integrated. At least a part of the voice output circuit that drives the sound wave generation devices may be integrated into for example the vertical system peripheral circuitry DRV. The voice output circuit is constituted by thin-film transistors, and is formed on the TFT substrate 500 along with the peripheral circuits. The voice signals for this voice output circuit are supplied from the pad 510.

On the color filter substrate 502, a three-color filter (R, G, B) 504 is arranged corresponding to each pixel of the TFT substrate 500. Incidentally, the boundary between each color of the three-color filter (R, G, B) is filled with a black matrix. In a vertical electric field (TN) system liquid crystal display, a common electrode (or an opposed electrode) is formed on this color filter (R, G, B) 504. In the horizontal electric field (IPS) system display, the opposed electrode is formed within each pixel on the TFT substrate side.

Figure 7A:
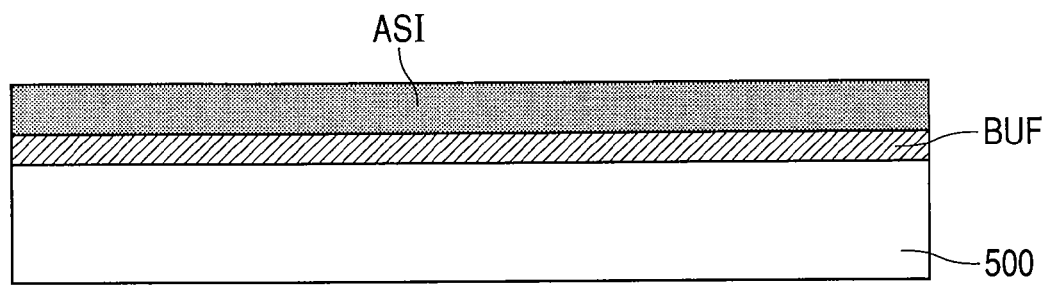
FIG. 7A is an illustration describing the fabrication process of the display according to an embodiment of the present invention.
Figure 7B:
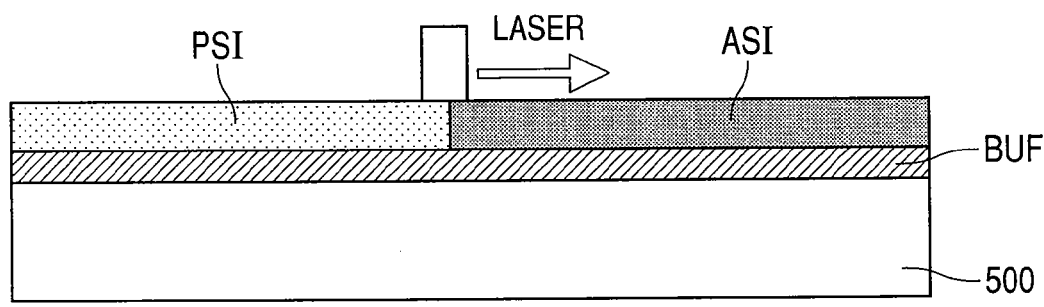
FIG. 7B is an illustration describing the fabrication process of the display according to an embodiment of the present invention following FIG. 7A.

Then, we will describe the embodiment for the manufacturing process of the display according to an embodiment of the present invention with reference to FIG. 7A through FIG. 7G. To begin with, a heat-resistant glass substrate 500 approximately 0.3 mm-1.0 mm thick and preferably subject to little deformation or shrinkage after a heat treatment at 400° C.-600° C. should be prepared. And preferably, a SiN film approximately 140 nm thick and a SiO film approximately 100 nm thick that function as thermal and chemical barrier films should be continuously and uniformly deposited by the CVD method on this glass substrate to constitute a foundation film BUF. And an amorphous silicon film ASI should be formed by the CVD and other suitable methods on this glass substrate 500 and the foundation layer BUF . . . . FIG. 7A Then, laser beams such as excimer laser should be irradiated in the direction of arrow, the amorphous silicon film ASI should be dissolved and crystallized, and the whole amorphous silicon film ASI on the glass substrate 500 should be reformed into a polysilicon film PSI . . . . FIG. 7B In place of the excimer laser beam ELA, other methods such as crystallization by solid pulse laser annealing, crystallization by pulse modulated laser, crystallization by lamp, Cat-CVD film, SiGe film that turns into a polysilicon film at the time of forming silicon film and the like may be used.

Figure 7C:
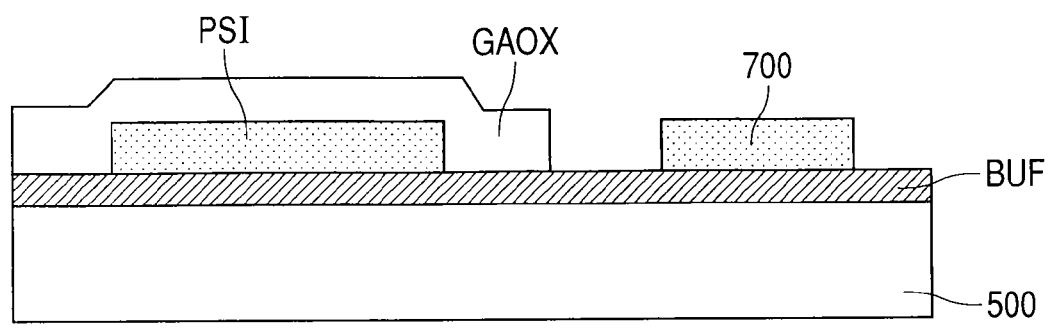
FIG. 7C is an illustration describing the fabrication process of the display according to an embodiment of the present invention following FIG. 7B.
Figure 7D:
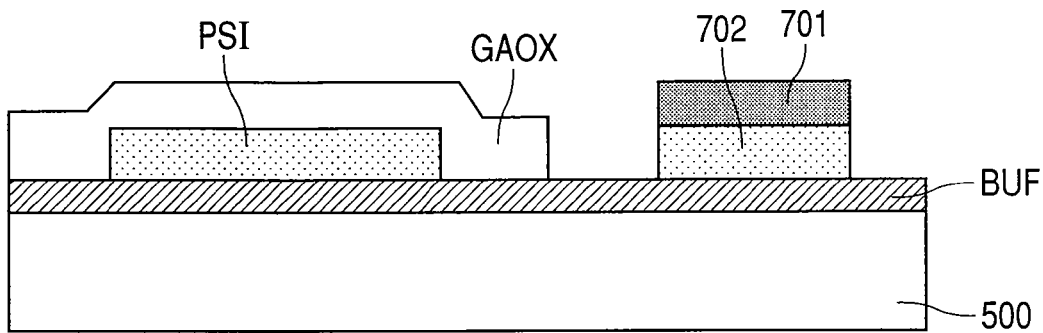
FIG. 7D is an illustration describing the fabrication process of the display according to an embodiment of the present invention following FIG. 7C.
Figure 7E:
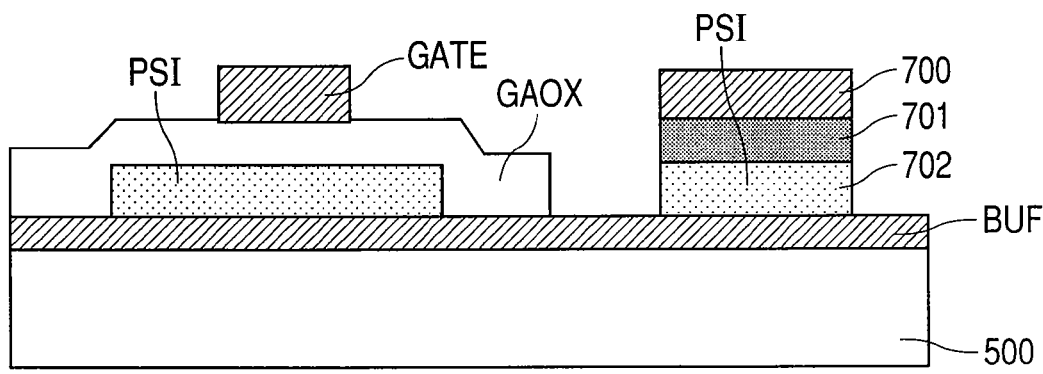
FIG. 7E is an illustration describing the fabrication process of the display according to an embodiment of the present invention following FIG. 7D.
Figure 7F:
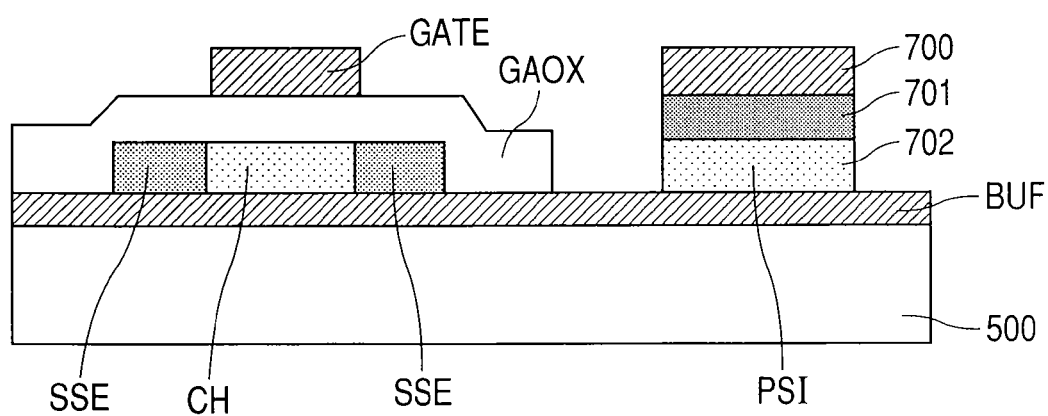
FIG. 7F is an illustration describing the fabrication process of the display according to an embodiment of the present invention following FIG. 7E.
Figure 7G:
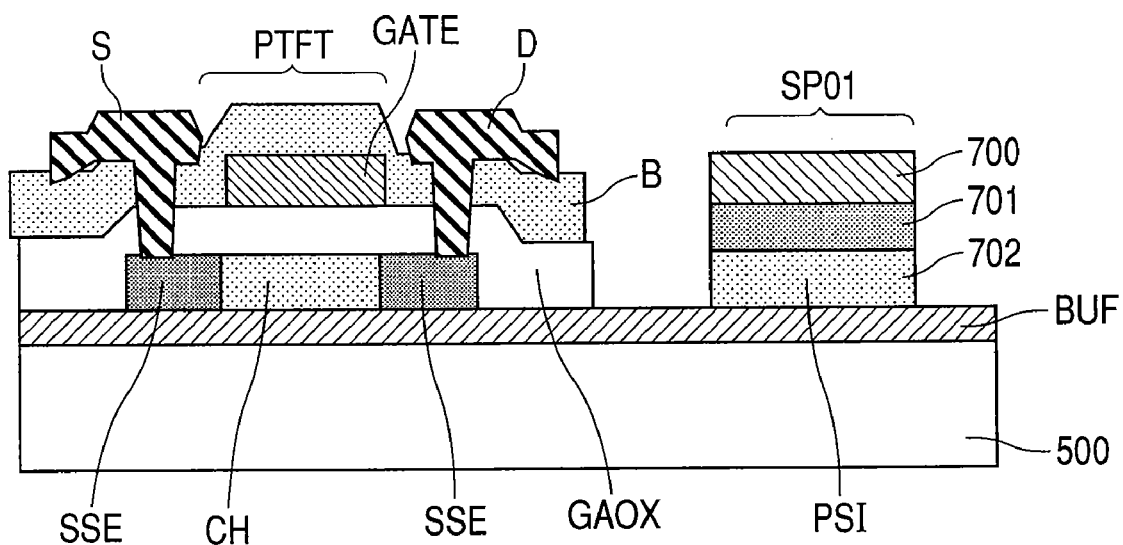
FIG. 7G is an illustration describing the fabrication process of the display according to an embodiment of the present invention following FIG. 7F.

The polysilicon film is changed to a tile form by applying the photolithography and etching and an island is formed for making thin-film transistors. Then, a gate insulation film GAOX is formed . . . . FIG. 7C Then, a polysilicon film is used to form the heat radiation layer 702 of the sound wave generation device SPO1, on which the heat insulation layer 701 and the amorphous silicon film are formed . . . . FIG. 7D After an injection of ions of impurities in order to control the threshold value in an area where thin-film transistors are formed, the gate electrodes GATE of thin-film transistors and the heat generation layer 700 are formed by applying the sputtering method or the CVD method . . . . FIG. 7E The source and drain regions SSE are formed by injecting the ions of impurities . . . . FIG. 7F After the activation of impurities, an interlayer insulation film B is formed by the CVD method and the like, and contact holes are formed in the interlayer insulation film B and the gate insulation film GAOX by the photolithography. Through these contact holes, metal layers for wiring are connected with the source and drain SSE of transistors to form wiring S and D. On top of these, an interlayer insulation film not shown is formed, and a protection insulation layer also not shown is further formed . . . . FIG. 7G By the process described above, it is possible to form polysilicon thin-film transistors and sound wave generation devices SPO1 on the same TFT substrate 500.

The possibility to emit sounds from the whole screen according to the second embodiment leads to the effect of enabling to realize natural and realistic sound reproduction matching with the screen images. And the arrangement of speakers is quite free, its construction is simple and highly integrated, it is easy to realize compact and slim components, and it has a wide range of output band. Low power consumption speakers can be formed on the same substrate as the display panel without sacrificing the output performance.

Third Embodiment

Figure 8:
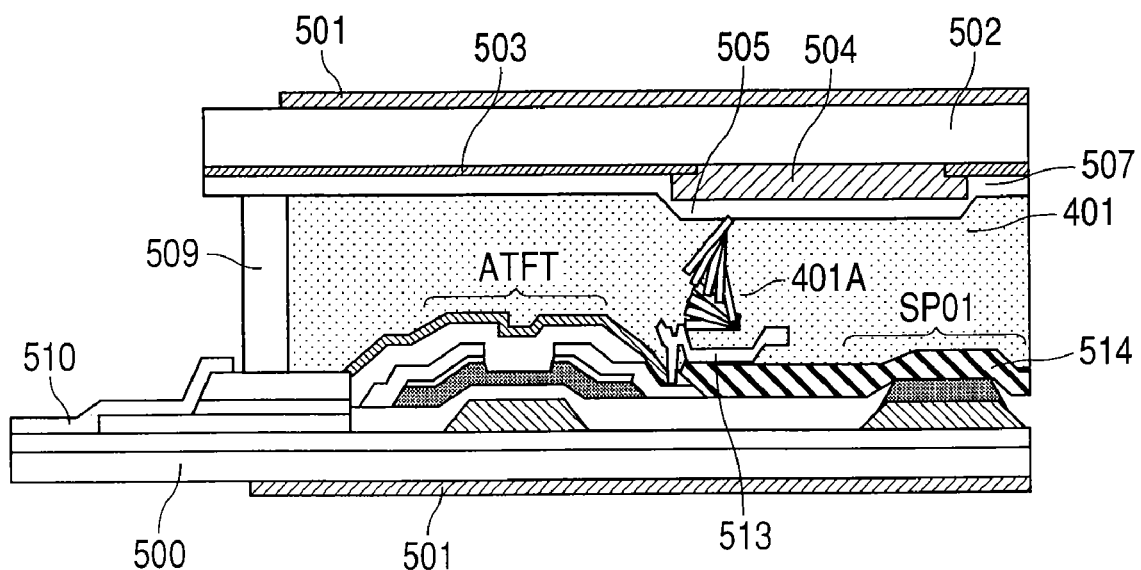
FIG. 8 is a sectional view describing the structure of the liquid crystal display with a built-in sound wave generation device according to the third embodiment of the present invention.
Figure 9:
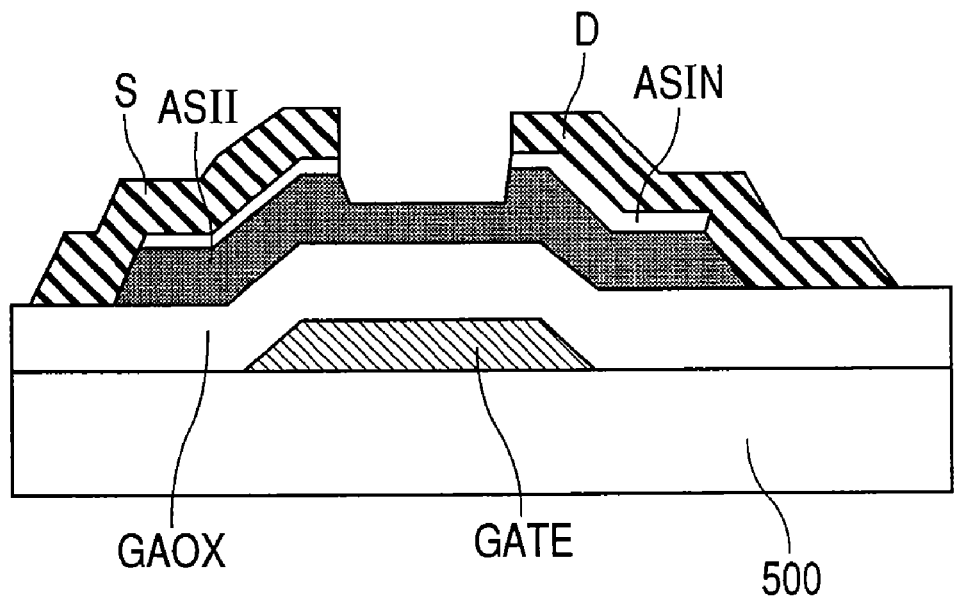
FIG. 9 is a sectional view describing the structure of an amorphous silicon thin-film transistor.
Figure 10:
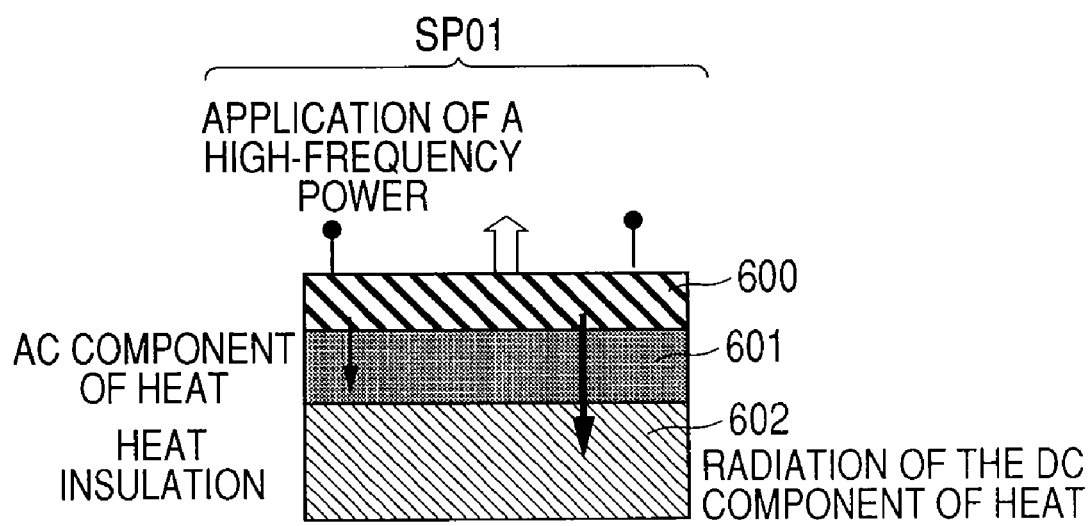
FIG. 10 is a sectional view describing the principle of operation of the sound wave generation device according to an embodiment of the present invention.

FIG. 8 is a sectional view describing the structure of a liquid crystal display having a built-in sound wave generation device described in the third embodiment of the present invention. FIG. 9 is a section view describing the structure of an amorphous silicon thin-film transistor ATFT. FIG. 10 is a sectional view describing the principle of operation of the sound wave generation device of the present invention. As shown in FIG. 8, the liquid crystal display according to the third embodiment includes a TFT substrate 500 on which amorphous silicon thin-film transistors AFTF for driving liquid crystal are formed and a color filter substrate 502, which are facing each other. And a liquid crystal layer 401 is enclosed between them. The TFT sound wave generation device SPO1 is formed on the same TFT substrate 500 as the thin-film transistor ATFT. The color filter substrate is constituted in the same way as the first embodiment and the second embodiment.

As shown in FIG. 9, the process of forming the amorphous silicon thin-film transistor ATFT starts with the formation of a molybdenum gate electrode GATE on the TFT substrate 500 made of a glass substrate followed by the successive deposition by the CVD method of a gate insulation film GAOX constituted by a silicon nitride film, an undoped amorphous silicon film ASII, and n-type doped amorphous silicon film ASIN. The amorphous silicon thin-film transistor is completed with the formation of the source electrode S and the drain electrode D. The channel is thick approximately 100 nm or more and 500 nm or less. The current flowing between the source electrode S and the drain electrode D can be controlled by the voltage applied to the gate electrode GATE.

In FIG. 10, the sound wave generation device SPO1 is a heat induced sound wave generation device including three layers of thin films, i.e. a heat generation layer 600 constituted by low-resistance metal wiring or ITO or ZnO and other transparent conductive films and electrically driven, an amorphous silicon heat insulation layer 601, and a heat radiation layer 602 made of the same material as the gate electrode GATE. Due to the generation of heat from the heat generation layer 600 and the provision of the heat insulation layer 601 having a very low specific heat conductivity, changes in the temperature of air above the surface of the heat generation layer grow large leading to the generation of sound waves. Due to absence of mechanical vibrations, this sound wave generation device has a number of advantages including a wide range of frequency, being hardly subject to the impacts of environment, and ease of miniaturization and arrangement in arrays.

The application of an AC field on both sides of the heat generation layer 600 results in AC-like changes in the temperature of the heat generation layer 600 due to Joule heating. At this time, since heat is hardly transmitted to the side of the heat insulation layer 601 due to the adiathermancy of the heat insulation layer, heat is exchanged efficiently with air near the surface of the heat generation layer 600, leading to the compression and dilatation of air and the generation of acoustic pressure. The heat that could not be converted into the acoustic pressure is released from the heat radiation layer 602. The sound wave generation devices are arranged in the same as the description in FIG. 6.

The possibility to emit sounds from the whole screen according to the third embodiment leads to the effect of enabling to realize natural and realistic sound reproduction matching with the screen images. And the arrangement of speakers is quite free, its construction is simple and highly integrated, it is possible to fabricate with the same process as that of TFT, it is easy to realize compact and slim components, and it has a wide range of output band. Low-power-consumption speakers can be formed on the same substrate as the display panel without sacrificing the output performance.

Fourth Embodiment

Figure 11:
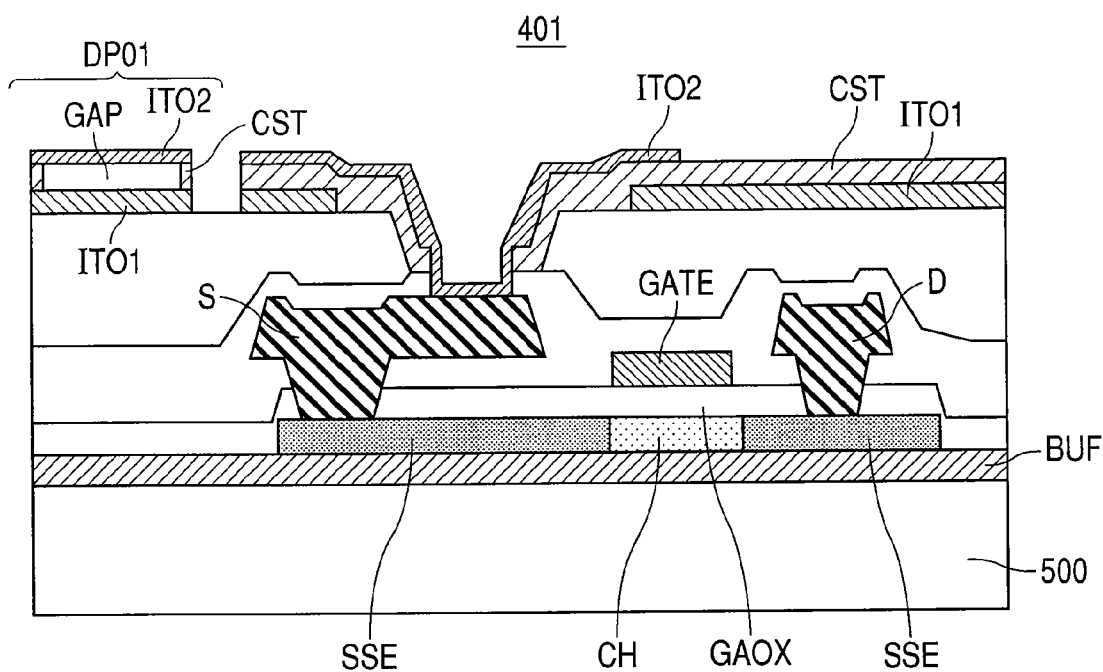
FIG. 11 is a sectional view of the thin-film transistor substrate constituting a display with a built-in pressure-sensitive device according to the fourth embodiment of the present invention.

FIG. 11 is a sectional view of the thin-film transistor substrate constituting the display with built-in pressure-sensitive device according to the fourth embodiment of the present invention. Although the display method of this display is the IPS method, it is needless to say that it can adapt to other methods. And the fact that the pressure-sensitive device DPO1 is formed at the top layer part of the auxiliary capacitance of the liquid crystal elements is another characteristic. The thin-film transistor TFT shown in FIG. 11 corresponds to the thin-film transistor for driving pixels, and is constituted by a transparent electrode ITO02 which will be a pixel electrode connected with the source electrode S, a transparent electrode ITO01 playing the role of the common electrode, and an insulation layer CST formed between the two electrodes.

It is possible to rotate the liquid crystal molecule of the liquid crystal layer 401 by the electric field applied between the transparent electrode ITO01 and the transparent electrode ITO02. And the structure of opposition between the transparent electrode ITO01 and the transparent electrode ITO02 through the insulation layer CST constitutes an auxiliary capacitance of the liquid crystal elements. The pressure-sensitive device DPO1 is constituted by a diaphragm having a gap GAP between the transparent electrode ITO01 and the transparent electrode ITO02. The gap GAP can be realized by removing the insulation layer CST by etching. In other words, the diaphragm can be fabricated by the same process as the fabricating process of the thin-film transistor TFT without increasing the number of layers. And the application of transparent conductive films such as ITO, ZnO and the like to the transparent electrode ITO01 and the transparent electrode ITO02 can provide a characteristic of transparency to the diaphragm of the pressure-sensitive device DPO1. This is advantageous for integration with the display because the pressure-sensitive device can be housed without causing any drop in aperture ratio and transmission factor.

Figure 12A:
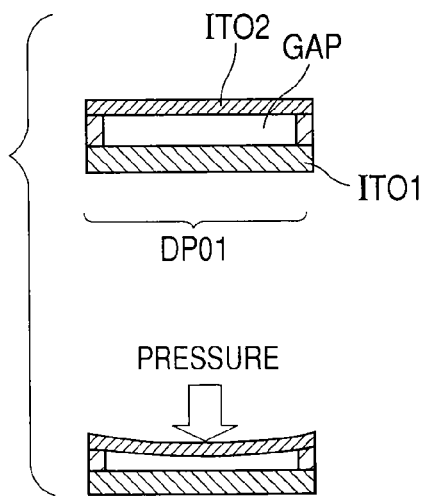
FIG. 12 is an illustration describing the principle of operation of a pressure-sensitive device.
Figure 12B:
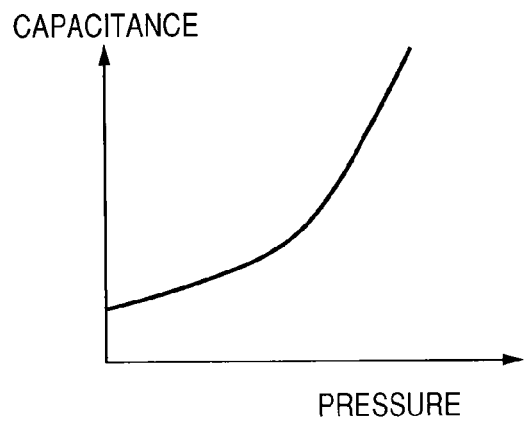

FIG. 12 is an illustration describing the principle of operation of the pressure-sensitive device DPO1. As shown in FIG. 12(a), because of changes in the gap GAP caused by pressure, it is possible to change the capacitance of the pressure-sensitive device DPO1. FIG. 12(b) shows changes in capacitance in relation to pressure by taking pressure in the horizontal axis and the capacitance in the vertical axis. Thus, a high-sensitivity pressure sensor that enables to find how much pressure is applied can be realized with a thin film by monitoring changes in electric capacitance.

Figure 13A:
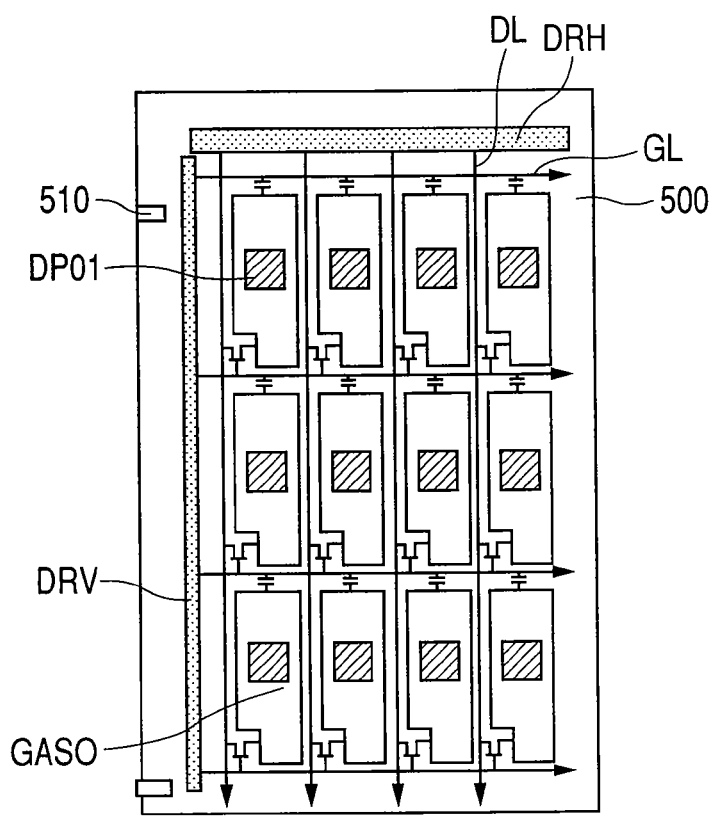
FIG. 13 is a schematic view of the display according to an embodiment of the present invention with a pressure-sensitive device housed in each pixel.
Figure 13B:
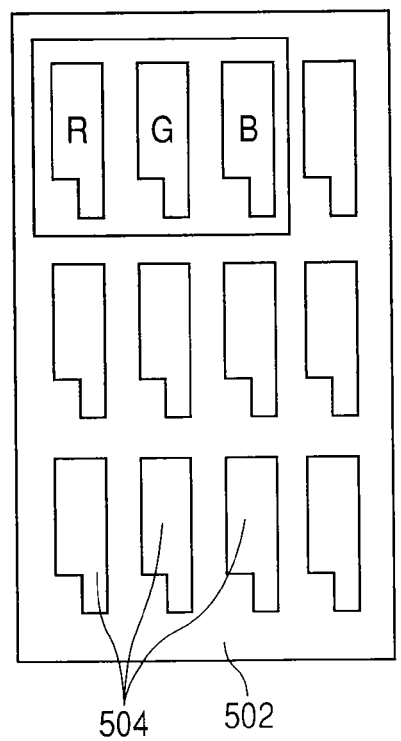

FIG. 13 is a schematic view of the display according to an embodiment of the present invention with a built-in pressure-sensitive device in the pixel. FIG. 13(a) shows the TFT substrate while FIG. 13(b) shows the color filter substrate. The TFT substrates and the color filter substrates are constituted in the same way as the preceding embodiment. The pressure-sensitive device DPO1, being transparent, can contain any drop in the display performance of the display. Accordingly, the pressure-sensitive device DPO1 can be fixed at any randomly chosen point of pixel. The direct input function on the display surface by touch panel, pen based input and the like and the microphone function for voice input can be realized on the same substrate as the TFT substrate. And it is easy to combine the same with the speaker function described in the preceding embodiment. And because of the actuator function it has, the pressure-sensitive device DPO1 can have a built-in acceleration sensor.

According to the fourth embodiment, a display integrating a highly sensitive, slim, light, narrow frame input function, actuator function and the display panel can be obtained by enclosing a pressure-sensitive sensor constituted by a transparent electrode within each pixel.

Figure 14:
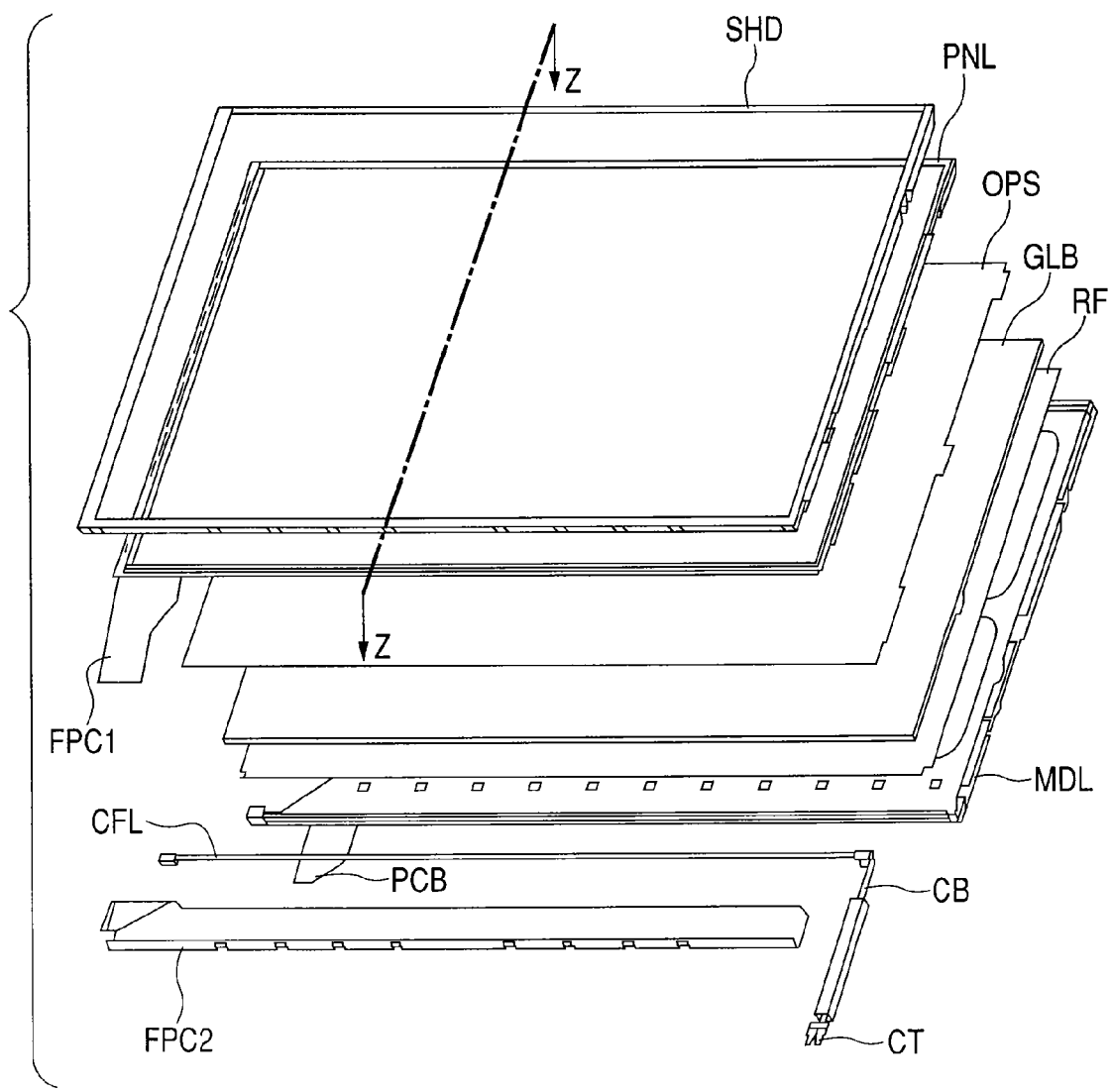
FIG. 14 is an exploded perspective view describing the structure of a liquid crystal display as the first example of the display according to an embodiment of the present invention.
Figure 15:
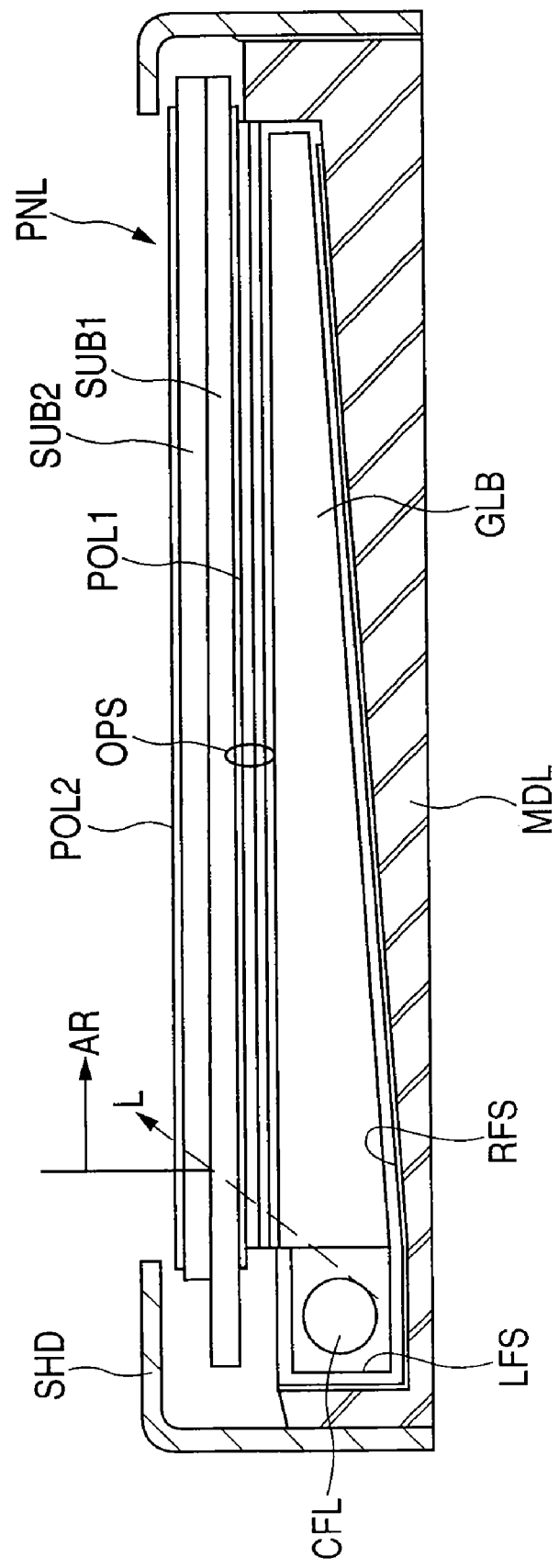
FIG. 15 is a sectional view cut out along the Z-Z line of FIG. 14.

FIG. 14 is an exploded perspective view describing the structure of a liquid crystal display as an example of the display according to an embodiment of the present invention. And FIG. 15 is a sectional view cut out along the Z-Z line of FIG. 14. This liquid crystal display is fabricated by using an active-matrix substrate which is the thin-film transistor substrate described above. In FIG. 14 and FIG. 15, the reference code PNL represents a liquid crystal cell obtained by pasting together the active-matrix substrate SUB1 and the color filter substrate SUB2 and filling the gap between them with the liquid crystal layer, both sides of which are covered with polarization plates POLL and POL2. And the reference code OPS represents an optical compensation member constituted by a dispersion sheet and a prism sheet, GLB represents an optical waveguide, CFL a cold cathode fluorescent lamp, RFS a reflection sheet, LFS a lamp reflection sheet, SHD a shield frame, and MDL represents a mold case.

A liquid crystal orientation layer is formed on the active-matrix substrate SUB1 having any one of the structures of the preceding embodiment, and an orientation restraining force is given to the same by rubbing and the like. After applying a sealing around the pixel region AR, the color filter substrate SUB2 on which an orientation film layer has been formed likewise is fixed opposite to the other, and this gap is filled with liquid crystal, and the opening for injecting the sealing material is sealed. And both sides of the liquid crystal cell PNL thus formed are covered with polarization plates PO1 and PO2, and the backup light constituted by the optical waveguide GLB, the cold cathode fluorescent lamp CFL and the like is implemented through the optical compensation member OPS to complete the fabrication process of a liquid crystal display. Incidentally, the peripheral circuitry including driving circuits in the periphery of the liquid crystal cell is supplied with data and timing signals through the flexible print substrates FPC1 and FPC2. The reference code PCB includes a timing converter for converting the display signals inputted from the external signal sources to the signal form to be displayed by displays between the external signal sources and each flexible print substrate FPC1 and FPC2.

The liquid crystal display using this active-matrix substrate is suitable for high-speed operation because of its excellent current driving capacity when the above outstanding polysilicon thin-film transistor circuit is included in its pixel circuit. In addition, due to limited variations in threshold voltage, it provides an excellent uniformity in the quality of its picture images and has an advantage of being capable of providing liquid crystal displays at a low price.

Figure 16:
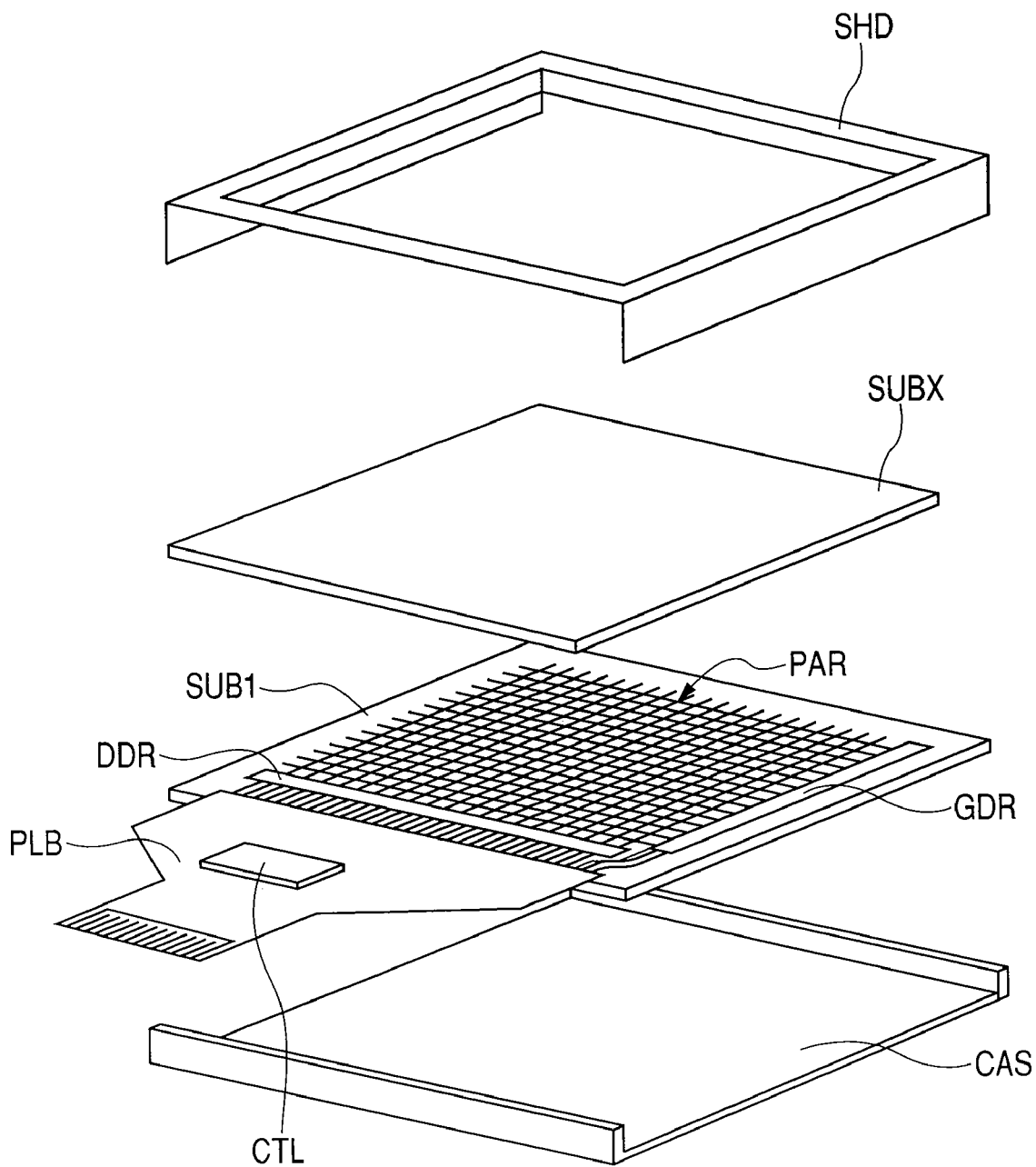
FIG. 16 is an exploded perspective view describing the structure of an organic EL display as the second example of the display according to an embodiment of the present invention.
Figure 17:
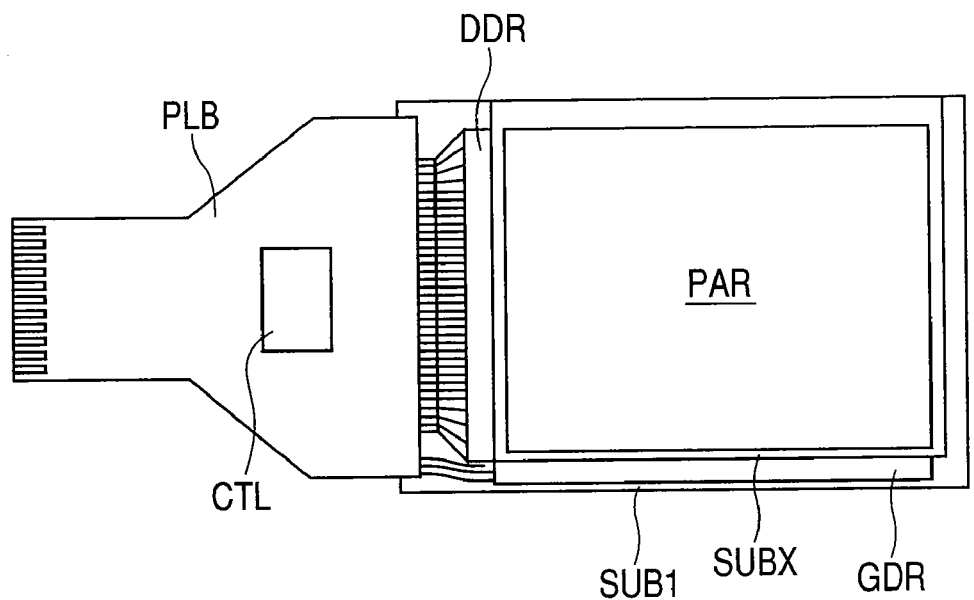
FIG. 17 is a top plan view of an organic EL display integrating the component elements shown in FIG. 16.

And it is possible to manufacture organic EL displays by using this active matrix substrate. FIG. 16 is an exploded perspective view describing an example of constituting the organic EL display as the second example of the display according to an embodiment of the present invention. And FIG. 17 is a top plan view of an organic EL display integrating the constituent elements shown in FIG. 16. Organic EL elements are formed on the pixel electrodes found on any one of the active matrix substrates SUB1 of each embodiment described above. An organic EL element is a multilayer body obtained by depositing successively a whole transportation layer, a light emitting layer, an electronic transportation layer, a cathode metallic layer and the like on the surface of pixel electrodes. A sealant is provided on the perimeter of the pixel area of the active matrix substrate SUB1 constituting such a multilayer body to seal the same with a sealing substrate SUBX or a sealing can. Or, protective films may be used in the place of these.

This organic EL display supplies its driving circuit area DDR with the display signals from external signal sources through the print circuit substrate PLB. This print circuit substrate PLB includes interface circuit chips CTL. And the upper case shield frame SHD and the lower case CAS are integrated to constitute an organic EL display.

For the active matrix driving of organic EL displays, the adoption of a high-quality pixel circuit is essential for the provision of good picture images because the organic EL element is current-driven light-emitting type, and the use of a pixel circuit constituted by CMOS thin-film transistors is desirable. And a thin-film transistor circuit formed in the drive-circuit area is essential for realizing high speed and high definition. The active matrix substrate SUB1 of this example of constitution has a high performance for satisfying such requirements. The organic EL display using the active matrix substrate according to an embodiment of the present invention is one of displays capable of giving full play to the characteristics of this example of constitution.

The present invention is not limited to the active matrix substrate of the display described above, is not limited to the constitution described in the claims and the constitution described in the embodiments and can be modified in various ways without deviating from the technological philosophy of the present invention. The present invention is not limited to displays, and semiconductor devices forming a semiconductor circuit and a sound wave generation device, a microphone, a pressure sensor and the like on a same wafer can be realized.

Figure 18:
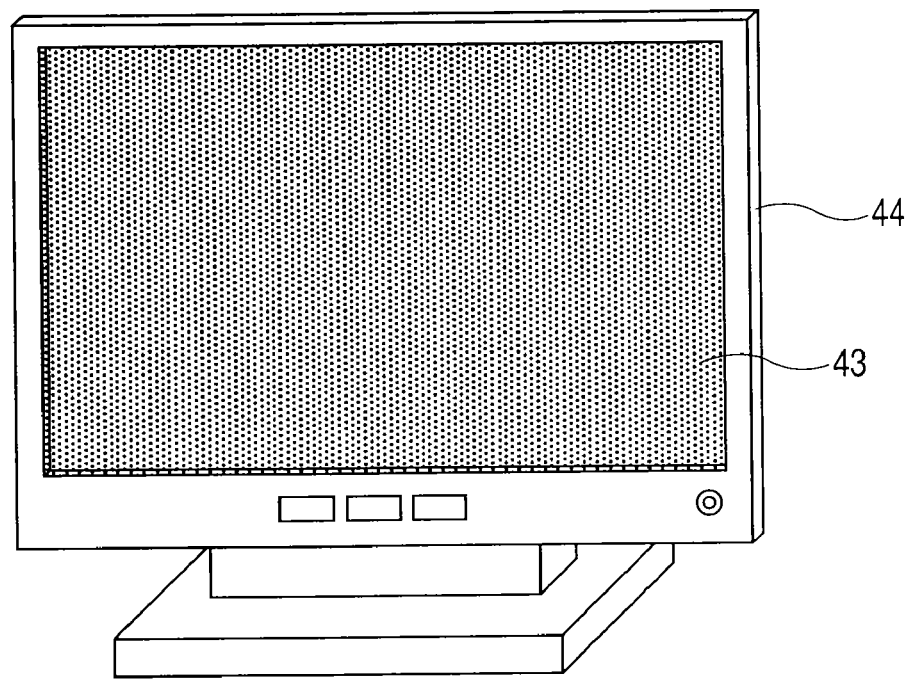
FIG. 18 is a perspective view of a display panel having a display according to an embodiment of the present invention.

FIG. 18 is a perspective view of a display panel having the display according to an embodiment of the present invention. This display panel 44 houses any one of the displays 43 according to the first to second embodiment of the present invention, and is used for computer monitors or for TV.

Figure 19:
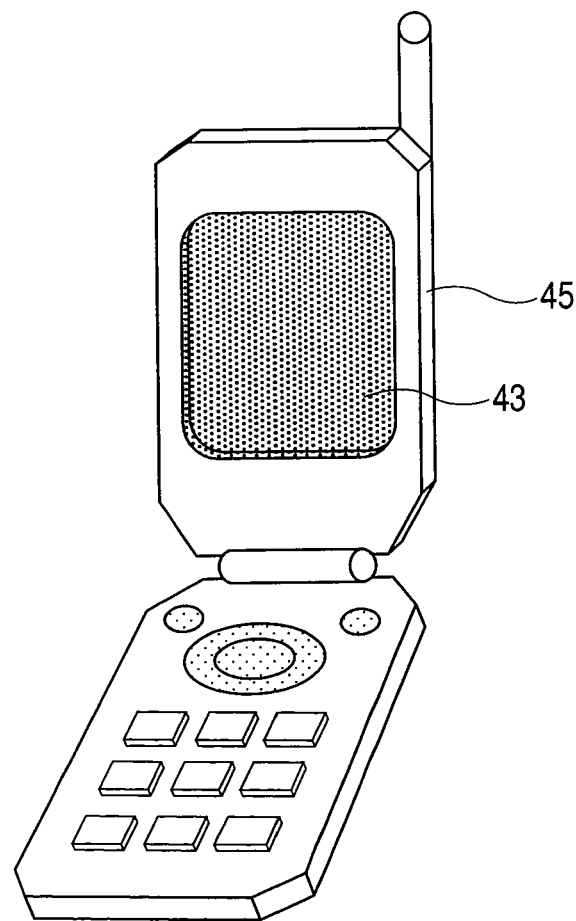
FIG. 19 is a perspective view of a mobile phone having a display according to an embodiment of the present invention.

FIG. 19 is a perspective view of a mobile phone having the display according to an embodiment of the present invention. This mobile phone 45 houses a display 43 according to the first to fourth embodiment of the present invention.

Figure 20:
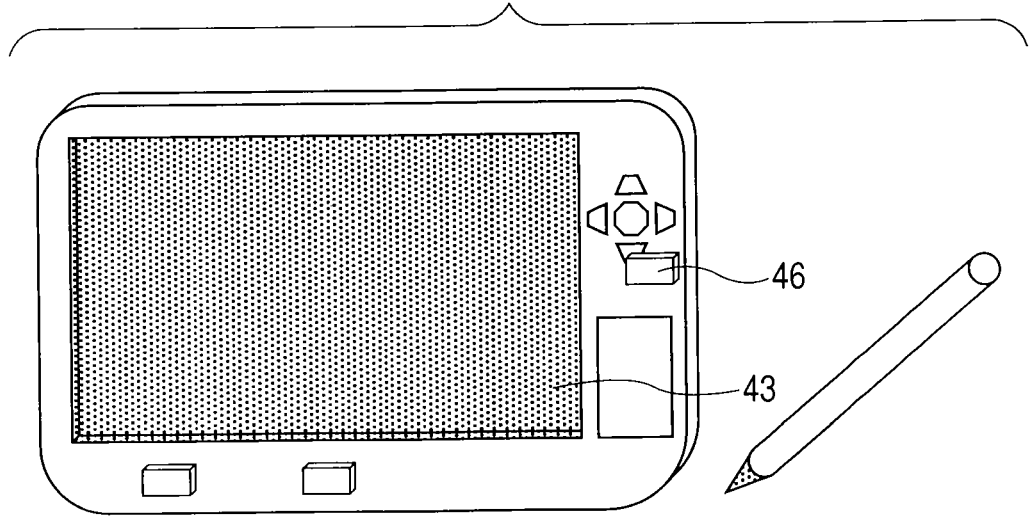
FIG. 20 is a perspective view of a mobile terminal having a display according to an embodiment of the present invention.

FIG. 20 is a perspective view of a mobile terminal having the display according to an embodiment of the present invention. The display 43 of this mobile terminal 46 houses a display according to the fourth embodiment of the present invention. This display may house only the pen-based input function described in the fourth embodiment, but it may have also a speaker function described in the first to third embodiments.

Figure 21:
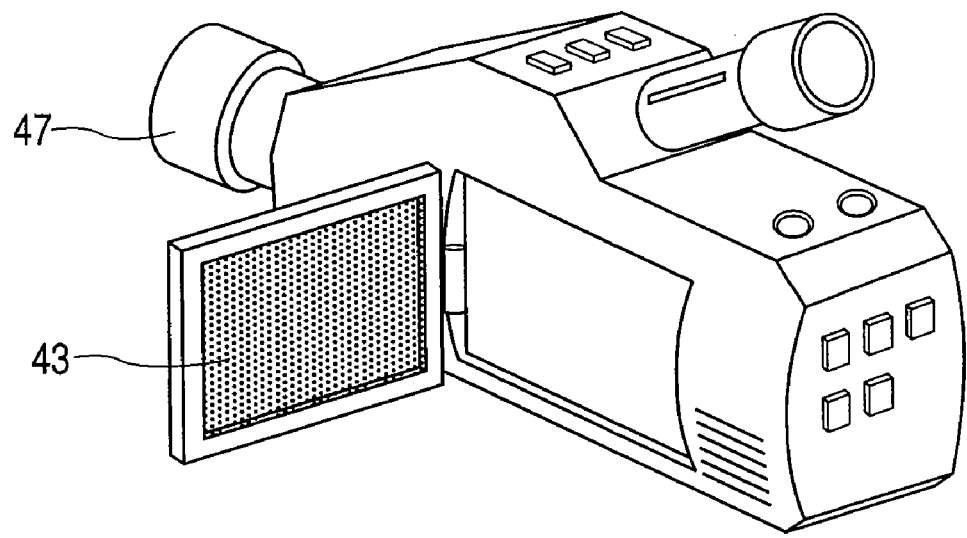
FIG. 21 is a perspective view of a digital video recorder having a display according to an embodiment of the present invention.

FIG. 21 is a perspective view of a digital video recorder having a display according to an embodiment of the present invention. The monitor 43 of this digital video recorder 47 houses a display according to the first to fourth embodiment of the present invention.

Figure 22:
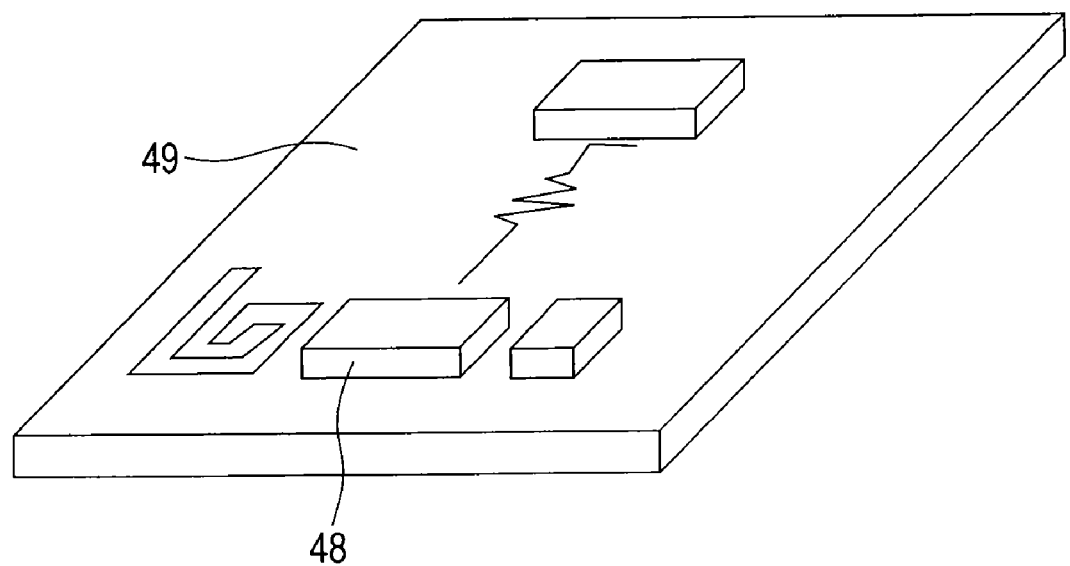
FIG. 22 is a perspective view of a personal identification IC card having a display according to an embodiment of the present invention.
Figure 23:
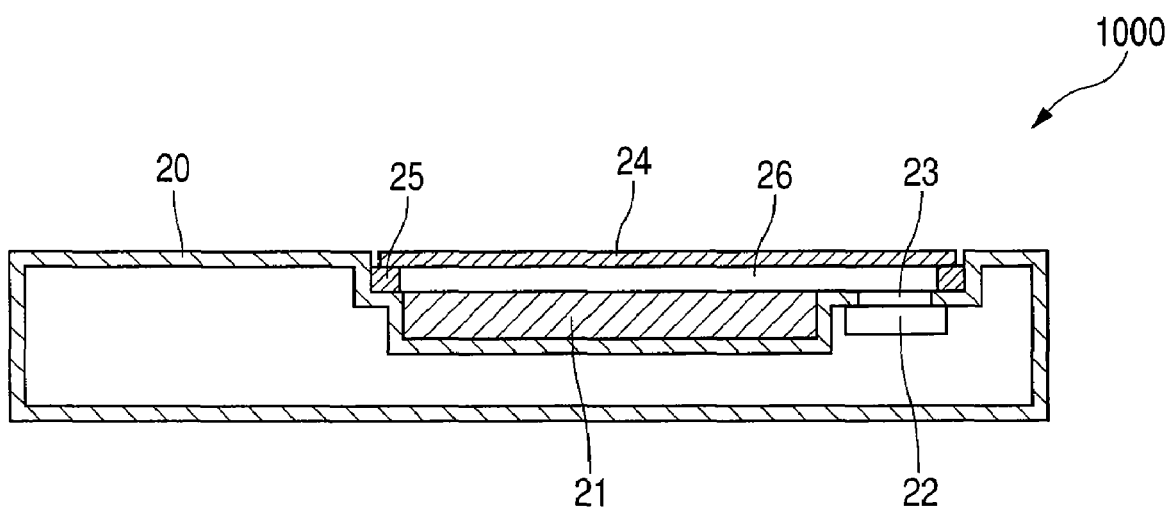
FIG. 23 is a sectional view of a mobile terminal having a conventional display with a speaker system.

FIG. 22 is a perspective view of a personal identification IC card having a display according to an embodiment of the present invention. This personal identification IC card 49 incorporates a thin-film semiconductor device 49 according to the embodiment of the present invention. The IC card requires a device for identification, and it is possible to realize an identification device based on a pressure-sensitive finger print sensor constituted by a thin-film semiconductor device 48.

It is possible to realize compact electronic appliances requiring low power not limited to displays by incorporating a thin-film semiconductor device having a speaker function, a microphone function, and a direct-input function into the semiconductor device.

What is claimed is:

1. A thin-film transistor-driven display having an insulating substrate, wherein a semiconductor thin film formed on the insulating substrate is used as a channel, the thin-film transistor-driven display comprising:

a sound wave generation device on the insulating substrate, the sound wave generation device comprising a heat radiation layer on the insulating substrate, a heat insulation layer on the heat radiation layer, and a heat generation layer on the heat insulation layer, the heat generation layer capable of creating acoustic pressure.

2. The display according to claim 1,
wherein said heat radiation layer is constituted by a first polycrystalline semiconductor having a thermal conductivity of A, said heat insulation layer is constituted by any one of a second polycrystalline or amorphous semiconductor having a thermal conductivity of B formed on said heat radiation layer, and said heat generation layer is constituted by a metal thin film formed on said heat insulation layer, and
wherein said thermal conductivity A is higher than said thermal conductivity B.

3. The display according to claim 2,
wherein said thermal conductivity A is twice or larger than said thermal conductivity B.

4. The display according to claim 1, wherein said heat radiation layer is constituted by a first metal thin layer having a thermal conductivity of A, said heat insulation layer is constituted by any one of a second polycrystalline or amorphous semiconductor having a thermal conductivity of B formed on said heat radiation layer, and said heat generation layer is constituted by a metal thin film, and
wherein said thermal conductivity A is larger than said thermal conductivity B.

5. The display according to claim 1,
wherein said heat radiation layer is constituted by a first metal thin layer having a thermal conductivity of A, said heat insulation layer is constituted by any one of a second polycrystalline or amorphous semiconductor having a thermal conductivity of B formed on said heat radiation layer, and said heat generation layer is constituted by a metal thin film, and
wherein said thermal conductivity A is twice or larger than said thermal conductivity B.

6. The display according to claim 1,
wherein said sound wave generation device functions as a speaker.

7. The display according to claim 1,
wherein said heat radiation layer is constituted by the same layer as the semiconductor thin film constituting the channel of said thin-film transistor.

8. The display according to claim 1,
wherein said heat generation layer is constituted by a same layer as the gate electrode of said thin-film transistor.

9. The display according to claim 1,
wherein said heat generation layer is constituted by a same layer as the source or drain electrode of said thin-film transistor.

10. The display according to claim 1,
wherein said heat insulation layer is constituted by the same layer as the semiconductor thin film constituting the channel of said thin-film transistor.

11. The display according to claim 1,
wherein said sound wave generation device is disposed in each pixel or within 5 mm from the periphery edge of the display.

12. The display according to claim 1,
wherein at least a part of the driving circuit of said sound wave generation device is constituted by said thin-film transistor formed on said insulating substrate.

13. The display according to claim 1, comprising:
a pressure-sensitive device on the same substrate as said insulating substrate.

14. The display according to claim 13,
wherein said pressure-sensitive device is constituted by a diaphragm the capacitance of which is constituted by two transparent layers of conductive thin films in the visible light region through a gap, and changes in pressure are detected by said capacitance.

15. The display according to claim 14,
wherein said pressure-sensitive device is installed to create responses to sound by oscillating in response to electric signals mutually acting with the diaphragm.

16. The display according to claim 13,
wherein said pressure-sensitive device encloses the direct input function by a touch panel or input with a pen in the display area.

17. The display according to claim 1, comprising:
pixels arranged in the matrix form;
a scanning line drive circuit; and
a signal line drive circuit for matrix driving said pixels,
wherein at least said signal line drive circuit has thin-film transistors.

18. The display according to claim 17, comprising:
opposed substrates disposed at predetermined intervals facing said insulating substrate and liquid crystal enclosed between said insulating substrate and said opposed substrate.

19. The display according to claim 17,
wherein said pixel comprises a light-emitting element having an organic EL layer.

* * * * *